(12) United States Patent
Sugama et al.

(10) Patent No.: US 8,362,846 B2
(45) Date of Patent: Jan. 29, 2013

(54) PACKAGE MANUFACTURING METHOD AND APPARATUS FOR PIEZOELECTRIC OSCILLATOR

(75) Inventors: Kazuyoshi Sugama, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 98 days.

(21) Appl. No.: 13/011,401

(22) Filed: Jan. 21, 2011

(65) Prior Publication Data
US 2011/0181368 A1  Jul. 28, 2011

(30) Foreign Application Priority Data

Jan. 25, 2010  (JP) ................................. 2010-013613

(51) Int. Cl.
*H03B 5/32* (2006.01)
(52) U.S. Cl. ............... 331/158; 331/116 R; 331/116 FE
(58) Field of Classification Search .................. 331/158, 331/116 R, 116 FE
See application file for complete search history.

(56) References Cited

U.S. PATENT DOCUMENTS

2011/0169584 A1 * 7/2011 Fukuda ......................... 331/158

FOREIGN PATENT DOCUMENTS

JP  2002-124845 A  4/2002

* cited by examiner

*Primary Examiner* — Arnold Kinkead
(74) *Attorney, Agent, or Firm* — Brinks Hofer Gilson & Lione

(57) ABSTRACT

A package manufacturing method capable of preventing recess portions from being formed in penetration electrodes. The package manufacturing method includes an electrode member forming step of inserting core portions made of a metallic material into cylindrical members made of a first glass material and heating the cylindrical members so as to weld the cylindrical members to the core portions, thus forming electrode members; a hole forming step of forming holes, in which the electrode members 8 are disposed, on a penetration electrode forming board wafer made of a second glass material; an electrode member disposing step of disposing the electrode members in the holes formed on the wafer; a welding step of heating the wafer and the electrode members so as to be welded to each other; and a cooling step of cooling the wafer and the electrode members. In the welding step, a pressurizing mold is placed on the surface of the wafer, the wafer is pressed by the pressurizing mold, and the wafer and the electrode members are heated to a temperature higher than the softening point of the first glass material and the softening point of the second glass material, whereby the wafer and the electrode members are welded to each other.

19 Claims, 15 Drawing Sheets

PACKAGE MANUFACTURING METHOD AND APPARATUS FOR PIEZOELECTRIC OSCILLATOR

RELATED APPLICATIONS

This application claims priority under 35 U.S.C. §119 to Japanese Patent Application No. 2010-013613 filed on Jan. 25, 2010, the entire content of which is hereby incorporated by reference.

BACKGROUND OF THE INVENTION

1. Field of the Invention

The present invention relates to a package manufacturing method which includes plural boards bonded to each other, a cavity formed at an inner side of the plural boards, and penetration electrodes that electrically connect the inside of the cavity to the outside of the plural boards, a piezoelectric vibrator in which a piezoelectric vibrating reed is mounted on the penetration electrodes and disposed at an inner side of the cavity, and an oscillator, an electronic device, and a radio-controlled timepiece each having the piezoelectric vibrator.

2. Description of the Related Art

Recently, piezoelectric vibrators utilizing quartz or the like have been used in cellular phones and portable information terminals as the time source, the timing source of a control signal, a reference signal source, and the like. Although there are various piezoelectric vibrators of this type, an SMD (Surface Mount Device)-type piezoelectric vibrator is known as one example thereof. As the piezoelectric vibrator of this type, a three-layered piezoelectric vibrator in which a piezoelectric board having a piezoelectric vibrating reed formed thereon is interposed between a base board and a lid board is known. In this case, the piezoelectric vibrating reed is accommodated in a cavity (sealed space) that is formed between the base board and the lid board.

Moreover, in recent years, instead of the three-layered piezoelectric vibrator, a two-layered piezoelectric vibrator has also been developed. The piezoelectric vibrator of this type has a two-layered structure in which a base board and a lid board are directly bonded, and a piezoelectric vibrating reed is accommodated in a cavity formed between the two boards. The two-layered piezoelectric vibrator is ideally used as it is superior in achieving a thin profile compared with the three-layered structure.

As an example of such a two-layered piezoelectric vibrator, a piezoelectric vibrator in which a conductive member such as a silver paste is filled in penetration holes formed in a base board made of a glass material and baked so as to form penetration electrodes, and piezoelectric vibrating reeds (quartz crystal vibrators) are electrically connected to outer electrodes provided outside the base board is known (for example, see JP-A-2002-124845).

However, in the penetration electrodes formed of the silver paste, since an organic material such as resin in the silver paste is removed by baking and its volume decreases, there is a case where a recess portion is formed on the surfaces of the penetration electrodes, or a hole is opened on the penetration electrodes. The recess portion or hole of the penetration electrodes may decrease the air-tightness of the inside of the cavity or degrade conduction between the piezoelectric vibrating reeds and the outer electrodes.

In recent years, a method of forming penetration electrodes using metal pins made of metallic material has been developed. In this method, first, metal pins are inserted through penetration holes formed in a penetration electrode forming wafer. Then, a glass frit is filled into a gap between the metal pins and the penetration holes, and the glass frit is baked so as to integrate the penetration electrode forming wafer and the metal pins to each other. By using the metal pins as the penetration electrodes, stable conduction can be secured.

However, since binders of the organic material included in the glass frit are removed by baking, there is a case where a recess portion caused by a decrease in the volume is formed on the surface of the glass frit. Moreover, the recess portion on the glass frit may cause short-circuiting in a later step of forming an electrode film, for example.

SUMMARY OF THE INVENTION

The present invention has been made in view of the above problems, and an object of the present invention is to provide a package manufacturing method capable of preventing a recess portion from being formed on the penetration electrodes.

The present invention provides the following means in order to solve the problems.

According to an aspect of the present invention, there is provided a package manufacturing method which includes plural boards bonded to each other, a cavity formed at an inner side of the plural boards, and penetration electrodes that electrically connect the inside of the cavity to the outside of the plural boards, the method including: an electrode member forming step of inserting core portions made of a metallic material into cylindrical members made of a first glass material and heating the cylindrical members so as to weld the cylindrical members to the core portions, thus forming electrode members; a hole forming step of forming holes, in which the electrode members are disposed, on a penetration electrode forming board wafer made of a second glass material; an electrode member disposing step of disposing the electrode members in the holes formed on the penetration electrode forming board wafer; a welding step of heating the penetration electrode forming board wafer and the electrode members so as to be welded to each other; and a cooling step of cooling the penetration electrode forming board wafer and the electrode members, wherein in the welding step, a pressurizing mold is placed on the surface of the penetration electrode forming board wafer, the penetration electrode forming board wafer is pressed by the pressurizing mold, and the penetration electrode forming board wafer and the electrode members are heated to a temperature higher than the softening point of the first glass material and the softening point of the second glass material, whereby the penetration electrode forming board wafer and the electrode members are welded to each other.

According to the above aspect of the present invention, since the penetration electrode forming board wafer is pressed by the pressurizing mold, and the penetration electrode forming board wafer and the electrode members are heated so as to be welded to each other, it is possible to form the penetration electrodes without using a glass frit which includes binders of an organic material. Therefore, there is no volume reduction resulting from the removal of the organic material, and it is possible to prevent a recess portion from being formed in the penetration electrodes.

In the cooling step, the rate of cooling from a heating temperature during the welding step to a temperature 50° C. higher than the strain point of the second glass material may be faster than the rate of cooling from a temperature 50° C. higher than the strain point to a temperature 50° C. lower than the strain point.

In this case, the rate of cooling from a heating temperature during the welding step to a temperature 50° C. higher than the strain point of the second glass material is faster than the rate of cooling from a temperature 50° C. higher than the strain point to a temperature 50° C. lower than the strain point. Since in the welding step, the penetration electrode forming board wafer is heated to the softening point higher than the strain point, when the penetration electrode forming board wafer is rapidly cooled in the cooling step, there is a possibility that strains will remain in the penetration electrode forming board wafer. Therefore, by decreasing the rate of cooling from a temperature 50° C. higher than the strain point to a temperature 50° C. lower than the strain point, it is possible to prevent the occurrence of strains in the penetration electrode forming board wafer.

The pressurizing mold may be formed of materials including any one of carbon, aluminum oxide, zirconium oxide, boron nitride, and silicon nitride as a main component.

In this case, since the pressurizing mold is formed of materials including any one of carbon, aluminum oxide, zirconium oxide, boron nitride, and silicon nitride as a main component, it is possible to prevent the pressurizing mold from being deformed at high temperatures. Moreover, the pressurizing mold can be easily demolded from the penetration electrode forming board wafer, and workability is good.

In the hole forming step, the holes may be formed by heating the penetration electrode forming board wafer while pressing the penetration electrode forming board wafer with a hole forming mold which is formed of a carbon material and has convex portions corresponding to the holes.

In this case, since the holes are formed using the hole forming mold, the holes can be formed easily and with high accuracy. Moreover, since the hole forming mold is formed of a carbon material, the second glass material of the softened penetration electrode forming board wafer will not adhere to the hole forming mold, and the solidified penetration electrode forming board wafer can be easily detached from the hole forming mold. Thus, the workability is good. Moreover, the hole forming mold absorbs gas generated from the penetration electrode forming board wafer when the penetration electrode forming board wafer is heated while the penetration electrode forming board wafer is pressed by the hole forming mold, thus preventing forming of pores in the penetration electrode forming board wafer. Thus, it is possible to secure air-tightness of the inside of the cavity.

The electrode members may have a truncated conical shape, and in the hole forming step, the inner circumferential surfaces of the holes may be formed in a tapered shape.

In this case, since the electrode members have a truncated conical shape, by forming the inner circumferential surfaces of the holes in a tapered shape, the electrode members can be easily disposed in the holes during the electrode member disposing step, and the workability is good.

In the hole forming step, the holes may be formed on the penetration electrode forming board wafer as recess portions, and after the cooling step, the penetration electrode forming board wafer on the bottom side of the recess portions may be polished to expose the core portions.

In this case, since the holes are formed as the recess portions, when the electrode members are disposed in the recess portions, the electrode members will come into contact with the bottom portions of the recess portions. Thus, the electrode members will not come out by passing through the recess portions.

When the holes are formed using the hole forming mold which is formed of a carbon material and has convex portions corresponding to the holes, by forming the holes as recess portions, molding of the convex portions of the hole forming mold can be performed easily compared to the case of forming the holes as penetration holes, for example.

In the electrode member forming step, the cylindrical members may be heated by inserting the core portions into the cylindrical members using rivet members having the core portions and the surface of the planar base portions on which the core portions are assembled and bringing the surfaces of the base portions into contact with the end surfaces of the cylindrical members.

In this case, in the electrode member forming step, since the core portions are inserted into the cylindrical members, and the surfaces of the base portions are brought into contact with the end surfaces of the cylindrical members, the core portions can be easily positioned inside the cylindrical members in the axial direction.

The first glass material and the second glass material may be the same material.

In this case, since the first glass material and the second glass material are the same material, the thermal expansion coefficients of the cylindrical members made of the first glass material and the penetration electrode forming board wafer made of the second glass material are equal to each other. Therefore, for example, when the electrode members and the penetration electrode forming board wafer are cooled during the cooling step, it is possible to reliably prevent the occurrence of a gap between the electrode members and the penetration electrode forming board wafer or the formation of cracks in the penetration electrode forming board wafer near the electrode members due to a difference in the thermal expansion coefficients of both.

According to another aspect of the present invention, there is provided a piezoelectric vibrator manufacturing method including the steps of performing the package manufacturing method according to the above aspect and disposing a piezoelectric vibrating reed on the inside of the cavity while mounting the piezoelectric vibrating reed on the penetration electrodes.

According to the above aspect of the present invention, since it is possible to prevent recess portions from being formed in the penetration electrodes, it is possible to secure conduction between the piezoelectric vibrating reed and the penetration electrodes. Moreover, since the penetration electrode forming board wafer and the electrode members are welded to each other, it is possible to secure the air-tightness of the inside of the cavity. As a result, it is possible to provide a highly reliable piezoelectric vibrator.

According to a still further aspect of the present invention, there is provided an oscillator in which a piezoelectric vibrator manufactured by the piezoelectric vibrator manufacturing method according to the above aspect of the present invention is electrically connected to an integrated circuit as an oscillating piece.

According to a still further aspect of the present invention, there is provided an electronic device in which a piezoelectric vibrator manufactured by the piezoelectric vibrator manufacturing method according to the above aspect of the present invention is electrically connected to a timer portion.

According to a still further aspect of the present invention, there is provided a radio-controlled timepiece in which a piezoelectric vibrator manufactured by the piezoelectric vibrator manufacturing method according to the above aspect of the present invention is electrically connected to a filter portion.

In the oscillator, electronic device, and radio-controlled timepiece according to the above aspects of the present invention, since they have a highly reliable piezoelectric vibrator, it is possible to provide an oscillator, an electronic device, and a radio-controlled timepiece having a high reliability.

According to the present invention, since the penetration electrode forming board wafer is pressed by the pressurizing mold, and the penetration electrode forming board wafer and the electrode members are heated so as to be welded to each other, it is possible to prevent the recess portions which cause short-circuiting during a step of forming an electrode film from being formed in the penetration electrodes. Moreover, it is possible to secure stable conduction between the piezoelectric vibrating reed and the outer electrodes and secure stable air-tightness of the inside of the cavity of the piezoelectric vibrator. Thus, it is possible to make the performance of the piezoelectric vibrator uniform.

DESCRIPTION OF PREFERRED EMBODIMENT

Hereinafter, an embodiment of the present invention will be described with reference to the drawings.
(Piezoelectric Vibrator)

Figure 3:
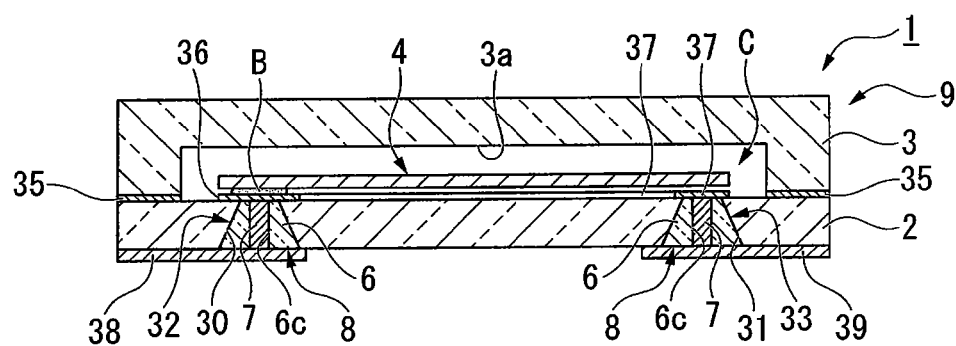
FIG. 3 is a sectional view of the piezoelectric vibrator taken along the line A-A in FIG. 2.
Figure 4:
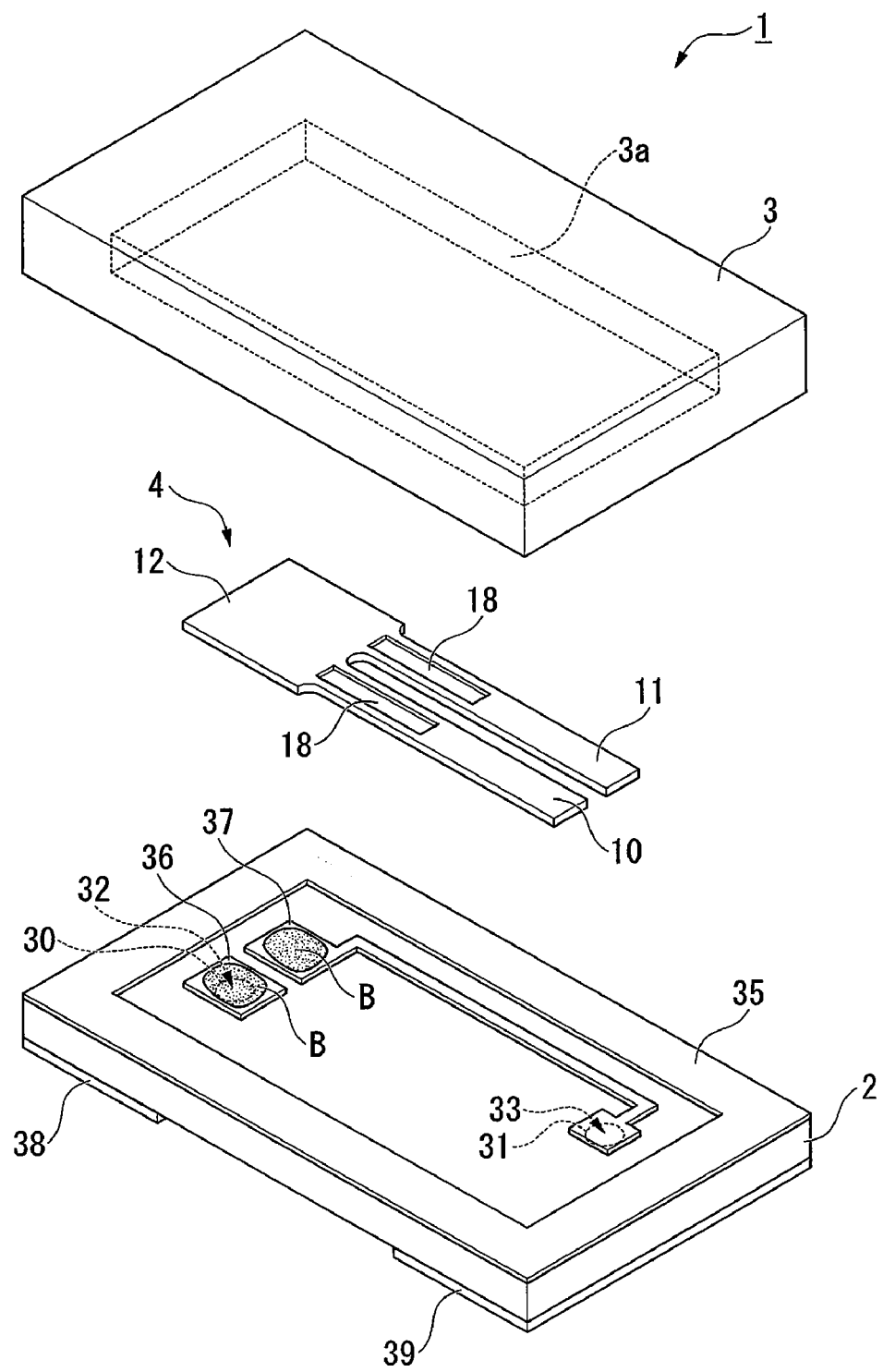
FIG. 4 is an exploded perspective view of the piezoelectric vibrator shown in FIG. 1.

As shown in FIGS. 1 to 4, a piezoelectric vibrator 1 according to the present embodiment is an SMD-type piezoelectric vibrator which has a package 9 in which a piezoelectric vibrating reed 4 is sealed in a cavity C that is formed between plural boards 2 and 3 bonded to each other. The package 9 is formed in the form of a box laminated in two layers of a base board 2 and a lid board 3. In FIG. 4, for better understanding of the drawings, illustrations of excitation electrode 15, extraction electrodes 19 and 20, mount electrodes 16 and 17, and weight metal film 21 described later are omitted.

Figure 5:
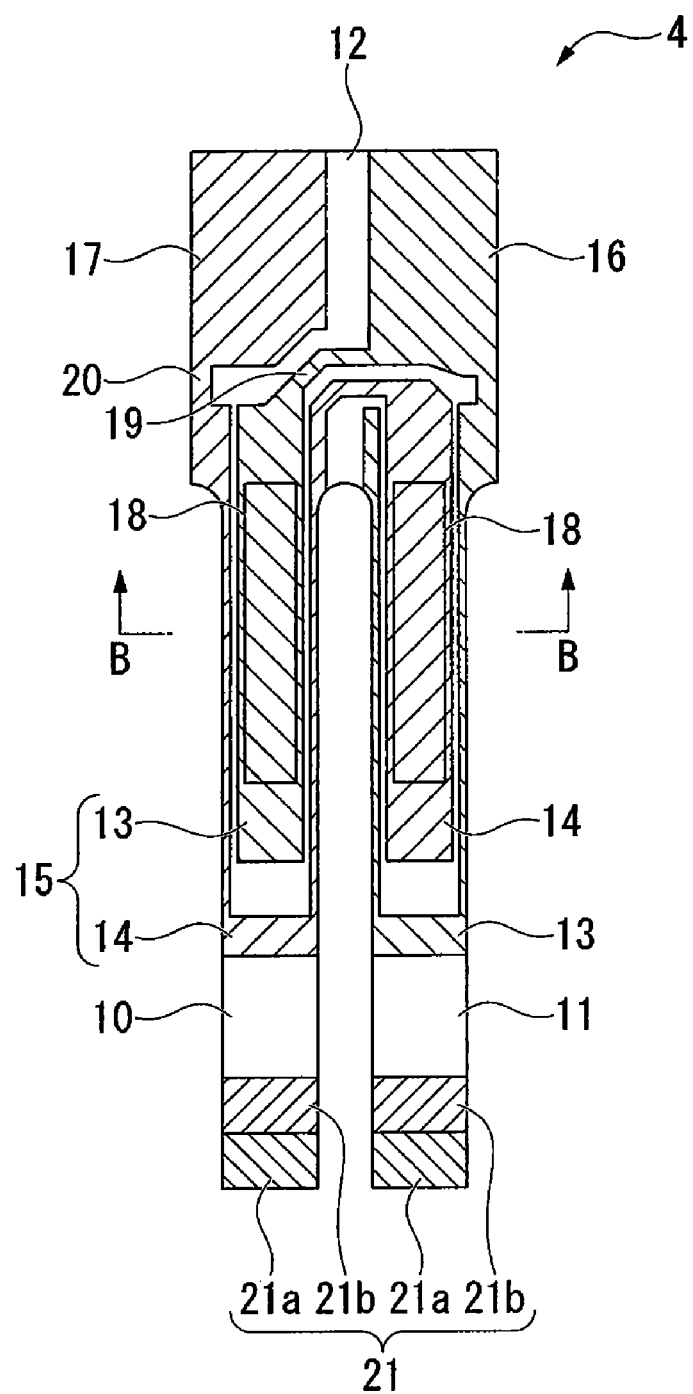
FIG. 5 is a top view of the piezoelectric vibrating reed that constitutes the piezoelectric vibrator shown in FIG. 1.
Figure 6:
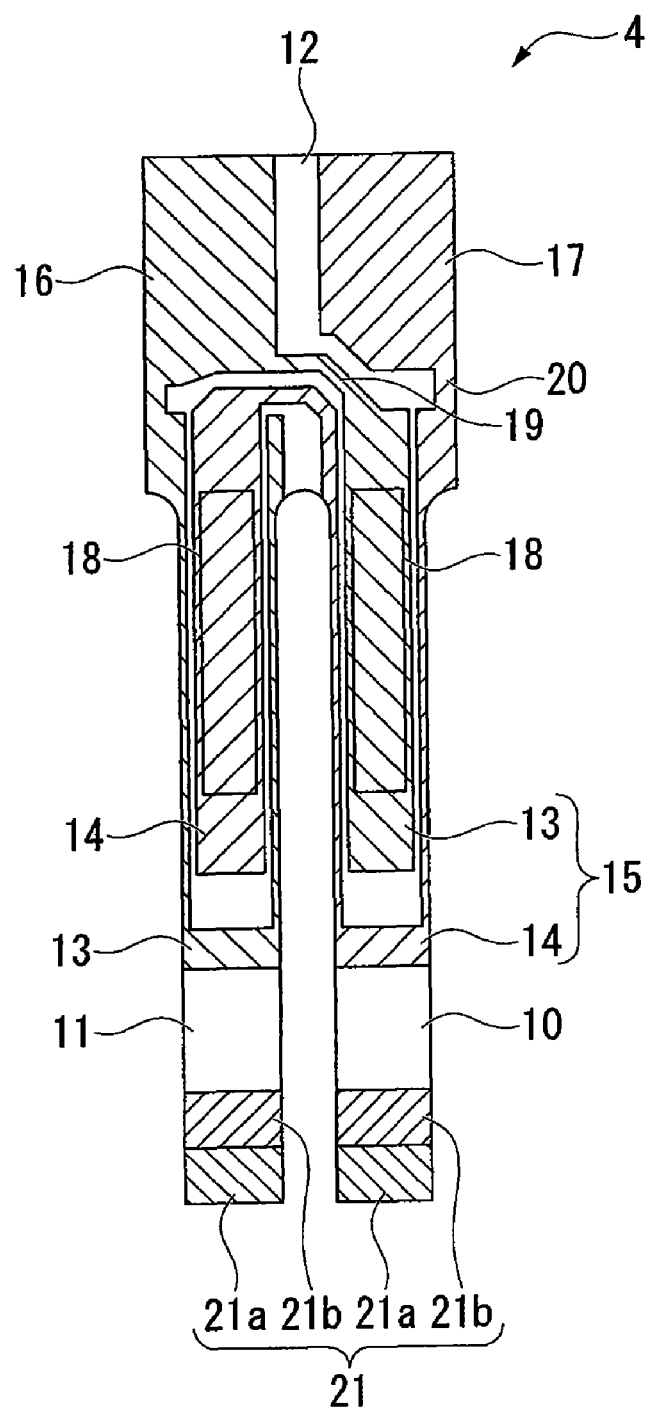
FIG. 6 is a bottom view of the piezoelectric vibrating reed shown in FIG. 5.
Figure 7:
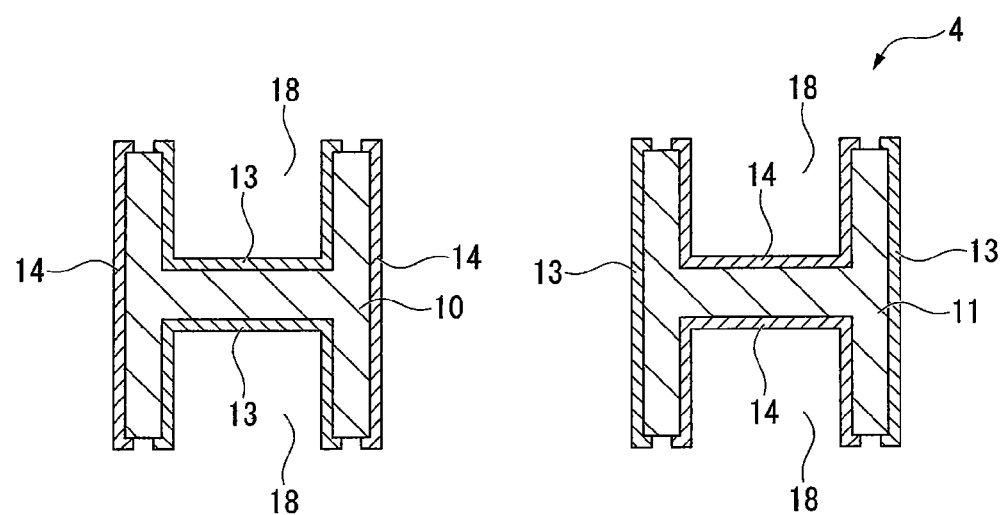
FIG. 7 is a sectional view taken along the line B-B in FIG. 5.

As shown in FIGS. 5 to 7, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the pair of vibrating arms 10 and 11 so as to allow the pair of vibrating arms 10 and 11 to vibrate and includes first and second excitation electrodes 13 and 14; and mount electrodes 16 and 17 which are electrically connected to the first and second excitation electrodes 13 and 14.

In addition, the piezoelectric vibrating reed 4 according to the present embodiment is provided with groove portions 18 which are formed on both principal surfaces of the pair of vibrating arms 10 and 11 along the longitudinal direction of the vibrating arms 10 and 11. The groove portions 8 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction to move closer to or away from each other and is patterned on the outer surfaces of the pair of vibrating arms 10 and 11 in an electrically isolated state.

Moreover, the first excitation electrode 13 and the second excitation electrode 14 are electrically connected to the mount electrodes 16 and 17 via the extraction electrodes 19 and 20, respectively, on both principal surfaces of the base portion 12.

Furthermore, the tip ends of the pair of vibrating arms 10 and 11 are coated with a weight metal film 21 for mass adjustment of their own vibration states (tuning the frequency) in a manner such as to vibrate within a predetermined frequency range. The weight metal film 21 is divided into a rough tuning film 21a used for tuning the frequency roughly and a fine tuning film 21b used for tuning the frequency finely.

The piezoelectric vibrating reed 4 configured in this way is bump-bonded to the upper surface of the base board 2 by bumps B made of gold or the like as shown in FIGS. 3 and 4. More specifically, bump bonding is achieved in a state where the pair of mount electrodes 16 and 17 comes into contact with two bumps B, respectively, formed on lead-out electrodes 36 and 37 described later, which are patterned on the upper surface of the base board 2. In this way, the piezoelectric vibrating reed 4 is supported in a state of being floated from the upper surface of the base board 2, and the mount electrodes 16 and 17 and the lead-out electrodes 36 and 37 are electrically connected to each other.

Figure 1:
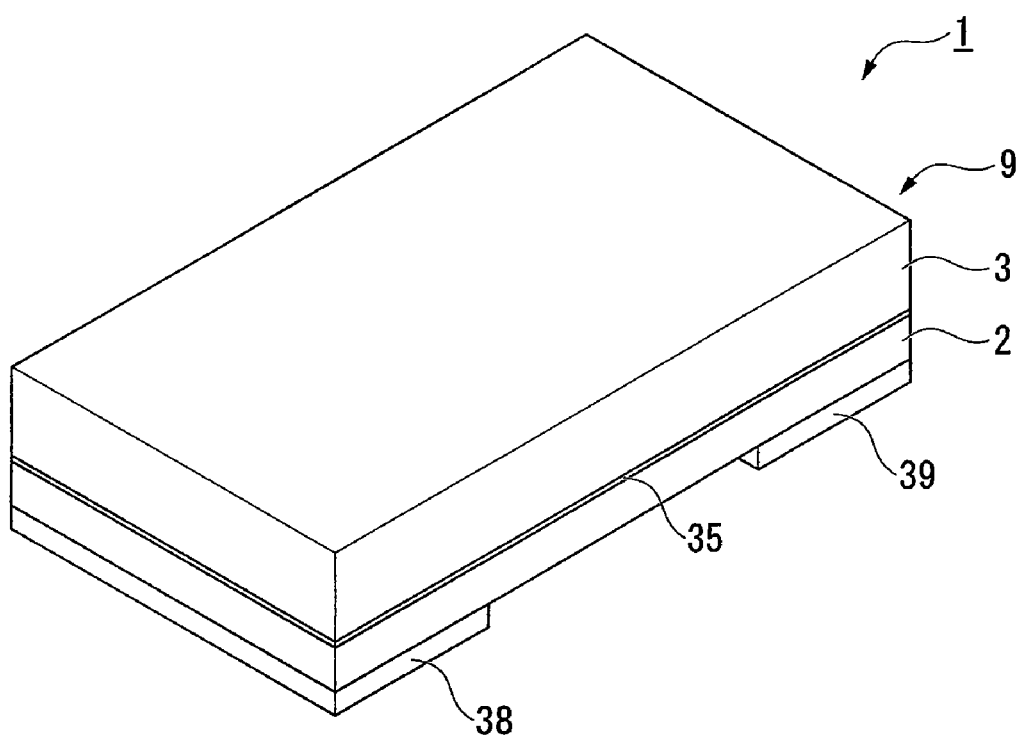
FIG. 1 is a perspective view showing an external appearance of a piezoelectric vibrator according to an embodiment of the present invention.
Figure 2:
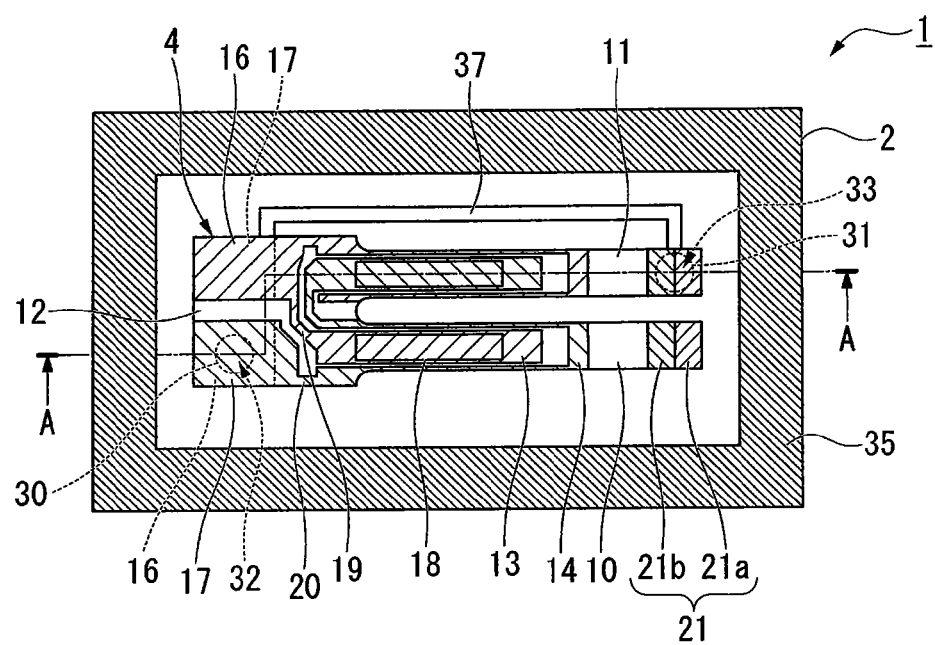
FIG. 2 is a top view showing an inner structure of the piezoelectric vibrator shown in FIG. 1 when a piezoelectric vibrating reed is viewed from above with a lid board removed.

The lid board 3 is a transparent insulating board made of a glass material, for example, soda-lime glass, and is formed in a board-like form as shown in FIGS. 1, 3, and 4. A bonding surface side thereof to be bonded to the base board 2 is formed with a rectangular recess portion 3a in which the piezoelectric vibrating reed 4 is accommodated. The recess portion 3a is a recess portion for a cavity serving as the cavity C that accommodates the piezoelectric vibrating reed 4 when the two boards 2 and 3 are superimposed onto each other. The lid board 3 is anodically bonded to the base board 2 in a state where the recess portion 3a faces the base board 2.

The base board 2 is a transparent insulating board made of glass material, for example, soda-lime glass, similarly to the lid board 3, and is formed in a board-like form having a size capable of being overlapped with the lid board 3, as shown in FIGS. 1 to 4.

The base board 2 is formed with a pair of through-holes (penetration holes) 30 and 31 penetrating through the base board 2 in the thickness direction thereof. The through-holes 30 and 31 of the present embodiment are formed such that one through-hole 30 is positioned at a corresponding position close to the base portion 12 of the mounted piezoelectric vibrating reed 4, and the other through-hole 31 is positioned at a corresponding position close to the tip ends of the vibrating arms 10 and 11. The present embodiment is described by way of an example of the through-holes which have a tapered sectional shape whose diameter gradually decreases from the lower surface of the base board 2 towards the upper surface. However, the present invention is not limited to this example, and the through-holes may be configured to penetrate straight through the base board 2. In any case, they only need to penetrate through the base board 2.

A pair of penetration electrodes 32 and 33 is formed in the pair of through-holes 30 and 31 so as to bury the through-holes 30 and 31. As shown in FIG. 3, the penetration electrodes 32 and 33 are formed by electrode members 8 each including a cylindrical member 6 and a core portion 7 which are integrally fixed to the through-holes 30 and 31. The penetration electrodes 32 and 33 serve to maintain the air-tightness of the inside of the cavity C by completely closing the through-holes 30 and 31 and achieve an electrical connection between the outer electrodes 38 and 39 described later and the lead-out electrodes 36 and 37.

Figure 8:
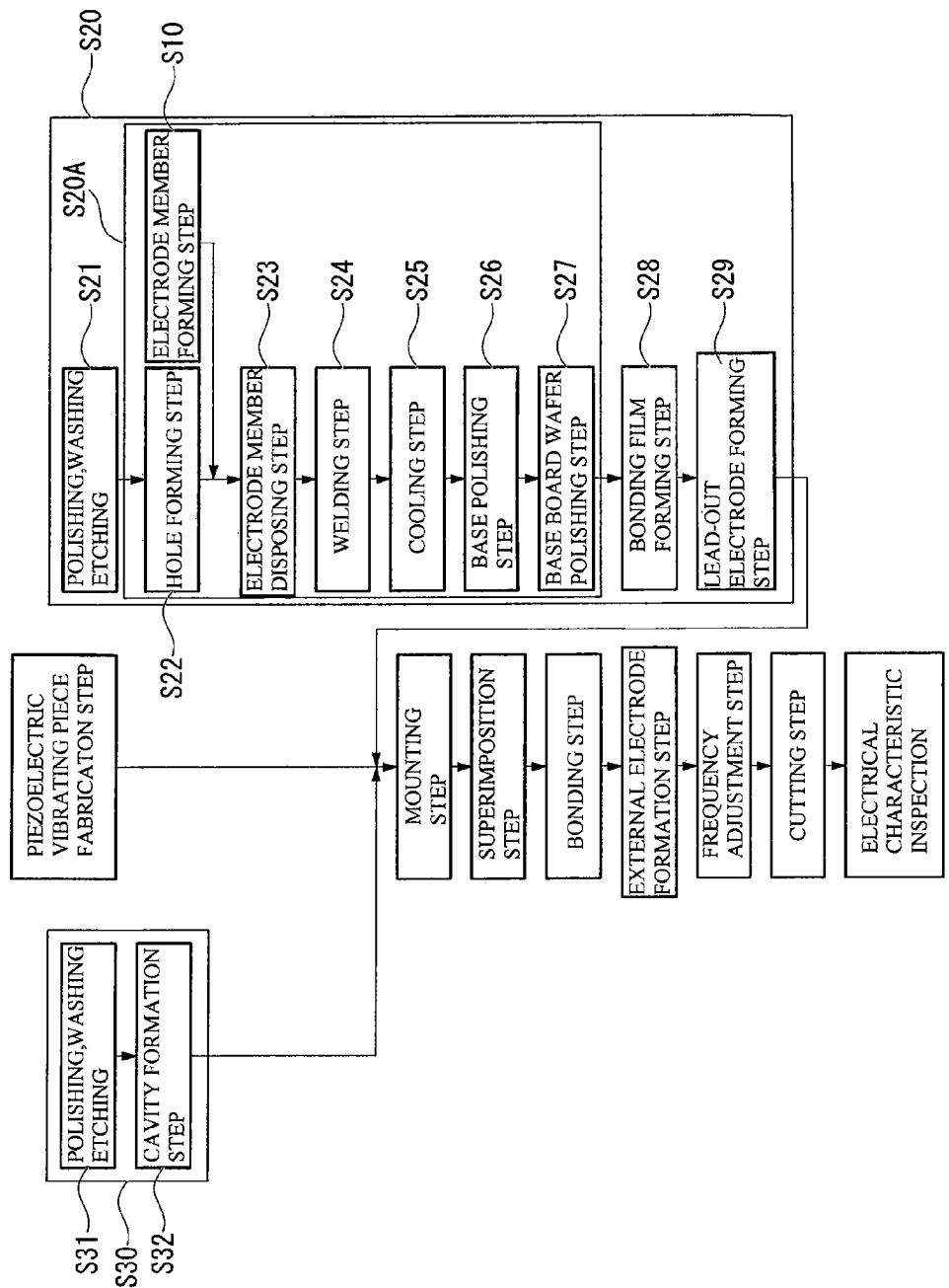
FIG. 8 is a flowchart showing the flow of the manufacturing process of the piezoelectric vibrator shown in FIG. 1.

As shown in FIG. 8, the cylindrical member 6 is formed of a glass material (first glass material), and in the illustrated example, is formed of the same material as the glass material (second glass material) that forms the base board 2. The cylindrical member 6 has a cylindrical shape of which both ends are flat and which has approximately the same thickness as the base board 2.

The thermal expansion coefficient of the glass material that forms the base board 2, the lid board 3, and the cylindrical member 6 is 7.5 to 8.5 ppm/° C., for example.

The core portion 7 is a conductive cylindrical core material made of metallic material, and similarly to the cylindrical member 6, has a shape which has flat ends and approximately the same thickness as the base board 2. The core portion 7 is positioned at a central hole 6c of the cylindrical member 6, and is tightly attached (welded) to the cylindrical member 6. The thermal expansion coefficient of the metallic material that forms the core portion 7 is preferably close to (preferably, equal to or lower than) that of the glass material that forms the base board 2 and the cylindrical member 6. Examples of such a metallic material include kovar and Fe—Ni alloys (42 alloy, 52 alloy, or the like). The core portion 7 may be formed of a Dumet wire, for example.

The electrode member 8 is formed into a truncated conical shape (tapered sectional shape) so as to comply with the shapes of the through-holes 30 and 31. That is, the cylindrical member 6 has a truncated conical outer shape. As shown in FIG. 4, the electrode member 8 is tightly attached (welded) to the through-holes 30 and 31 in a state of being disposed in the through-holes 30 and 31, whereby the penetration electrodes 32 and 33 are formed. The electrical connection of the penetration electrodes 32 and 33 is secured via the conductive core portion 7.

As shown in FIGS. 1 to 4, the upper surface side of the base board 2 (the bonding surface side to be bonded to the lid board 3) is patterned with a bonding film 35 for anodic bonding and the pair of lead-out electrodes 36 and 37 by a conductive material (for example, aluminum). Among them, the bonding film 35 is formed along the peripheral edge of the base board 2 so as to surround the periphery of the recess portion 3a formed on the lid board 3.

Moreover, the pair of lead-out electrodes 36 and 37 are patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

The bumps B are formed on the pair of lead-out electrodes 36 and 37, and the piezoelectric vibrating reed 4 is mounted via the bumps B. In this way, the one mount electrode 16 of the piezoelectric vibrating reed 4 is electrically connected to the one penetration electrode 32 via the one lead-out electrode 36, and the other mount electrode 17 is electrically connected to the other penetration electrode 33 via the other lead-out electrode 37.

Moreover, the lower surface of the base board 2 is formed with the outer electrodes 38 and 39 which are electrically connected to the pair of penetration electrodes 32 and 33, respectively, as shown in FIGS. 1, 3, and 4. That is, one outer electrode 38 is electrically connected to the first excitation electrode 13 of the piezoelectric vibrating reed 4 via the one penetration electrode 32 and the one lead-out electrode 36. In addition, the other outer electrode 39 is electrically connected to the second excitation electrode 14 of the piezoelectric vibrating reed 4 via the other penetration electrode 33 and the other lead-out electrode 37.

When the piezoelectric vibrator 1 configured in this manner is operated, a predetermined drive voltage is applied between the pair of outer electrodes 38 and 39 formed on the base board 2. In this way, a current can be made to flow to the excitation electrode 15 including the first and second excitation electrodes 13 and 14, of the piezoelectric vibrating reed 4, and the pair of vibrating arms 10 and 11 is allowed to vibrate at a predetermined frequency in a direction to move closer to or away from each other. This vibration of the pair of vibrating arms 10 and 11 can be used as the time source, the timing source of a control signal, the reference signal source, and the like.

(Piezoelectric Vibrator Manufacturing Method)

Next, a method for manufacturing the above-described piezoelectric vibrator 1 will be described with reference to the flowchart shown in FIG. 8.

First, a step of manufacturing a base board wafer (penetration electrode forming wafer) 41 later serving as the base board 2 is performed (S20). First, a disk-shaped base board wafer 41 is formed by polishing a soda-lime glass to a predetermined thickness, cleaning the polished glass, and removing the affected uppermost layer by etching or the like (S21).

(Penetration Electrode Forming Step)

Subsequently, a penetration electrode forming step is performed where the penetration electrodes 32 and 33 are formed on the base board wafer 41 (S20A).

(Electrode Member Forming Step)

Figure 9:
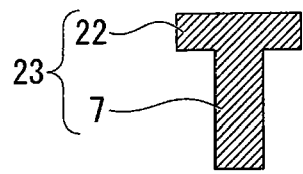
FIG. 9 is a diagram showing an electrode member forming step of the piezoelectric vibrator manufacturing method shown in FIG. 8.
Figure 10:
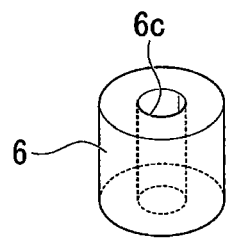
FIG. 10 is a diagram showing the electrode member forming step of the piezoelectric vibrator manufacturing method shown in FIG. 8.

First, as shown in FIGS. 9 to 12, an electrode member forming step is performed where the core portion 7 is inserted into the cylindrical member 6, and the cylindrical member 6 is heated, whereby the cylindrical member 6 is welded to the core portion 7 to form the electrode member 8 (S10). At this time, as shown in FIG. 9, a rivet member 23 which includes the core portion 7 and a conductive planar base portion 22 on which the core portion 7 is assembled is used.

Figure 11:
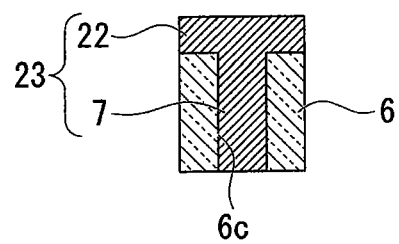
FIG. 11 is a diagram showing the electrode member forming step of the piezoelectric vibrator manufacturing method shown in FIG. 8.

In this step, first, as shown in FIG. 11, the core portion 7 is inserted into the cylindrical member 6, and the surface of the base portion 22 is brought into contact with the end surface of the cylindrical member 6. In this way, the core portion 7 can be easily positioned inside the cylindrical member 6 in the axial direction. In the illustrated example and at this stage of the process, the cylindrical member 6 has a cylindrical shape (straight sectional shape).

Figure 12:
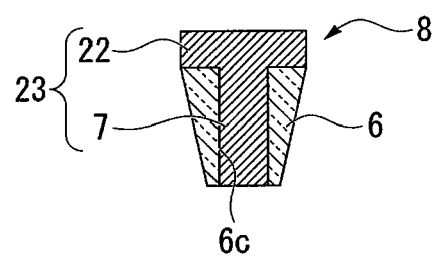
FIG. 12 is a diagram showing the electrode member forming step of the piezoelectric vibrator manufacturing method shown in FIG. 8.

Subsequently, the cylindrical member 6 in which the core portion 7 is inserted is placed on a carbon mold (not shown) and heated. At this time, the cylindrical member 6 may be pressed during the heating. In this way, as shown in FIG. 12, the cylindrical member 6 melted in the carbon mold is deformed and welded to the rivet member 23, and the electrode member 8 having the cylindrical member 6 which has a truncated conical outer shape is formed.

(Hole Forming Step)

Figure 13:
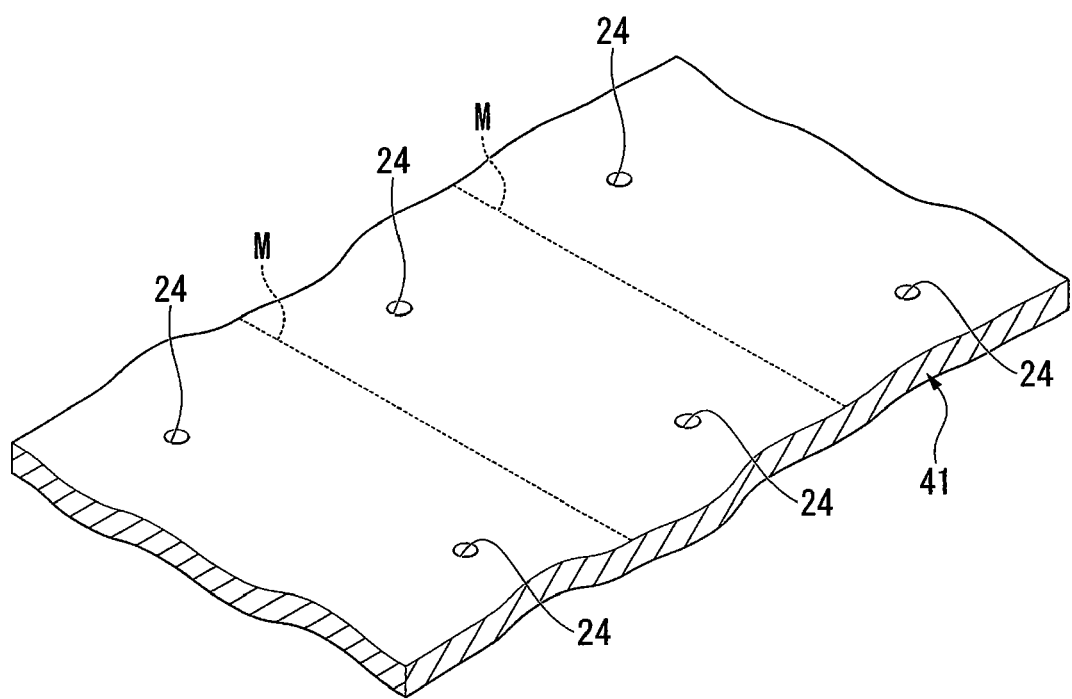
FIG. 13 is a diagram showing a recess forming step of the piezoelectric vibrator manufacturing method shown in FIG. 8.

Subsequently, as shown in FIG. 13, a step of forming recess portions (holes) 24 through which the electrode member 8 is disposed in the base board wafer 41 is performed (S22). The dotted line M shown in FIG. 13 is a cutting line along which the base board wafer 41 is cut in a cutting step described later.

Figure 14:
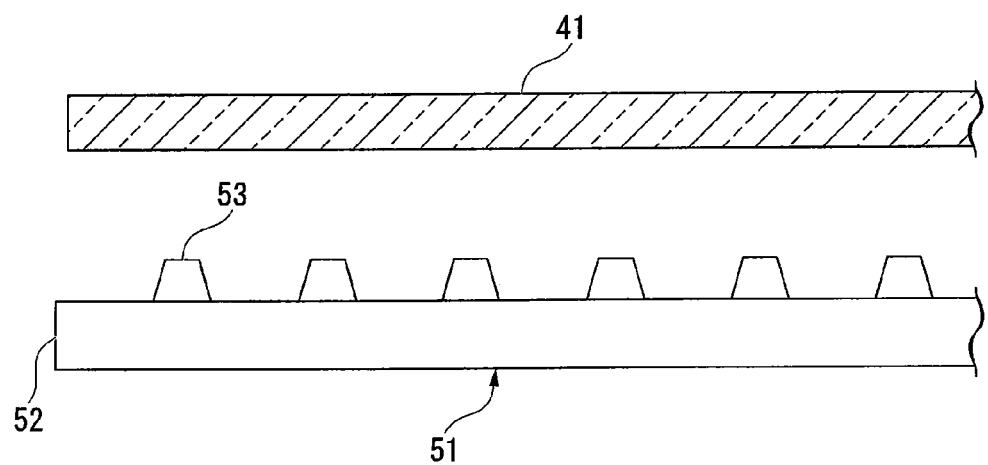
FIG. 14 is a diagram showing the recess forming step of the piezoelectric vibrator manufacturing method shown in FIG. 8.

In the present embodiment, the forming of the recess portions 24 is performed by heating the base board wafer 41 while pressing the base board wafer 41 with a recess forming mold (hole forming mold) 51 shown in FIG. 14.

The recess forming mold 51 includes a planar portion 52 and convex portions 53 formed on one surface of the planar portion 52 and is formed of a carbon material, for example.

The planar portion 52 is a flat member which makes contact with the surface of the base board wafer 41 when pressing the base board wafer 41.

The convex portions 53 are members that form the recess portions 24 when pressing the base board wafer 41. The height of each of the convex portions 53 is lower than the thickness of the base board wafer 41. The convex portions 53 have a truncated conical shape of which the side surfaces are tapered for mold removal.

Figure 15:
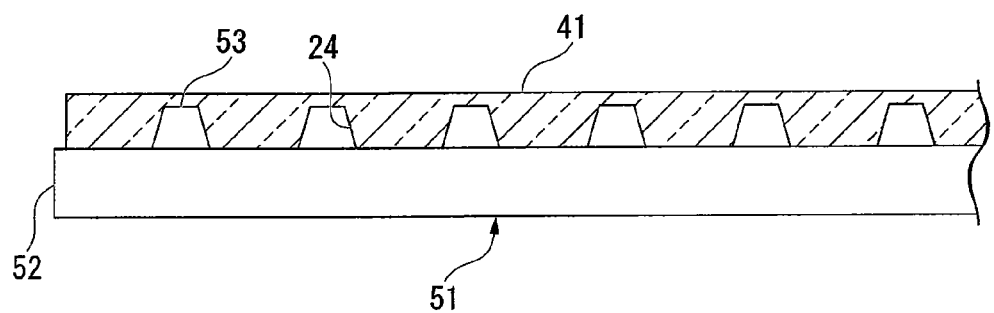
FIG. 15 is a diagram showing the recess forming step of the piezoelectric vibrator manufacturing method shown in FIG. 8.
Figure 16:
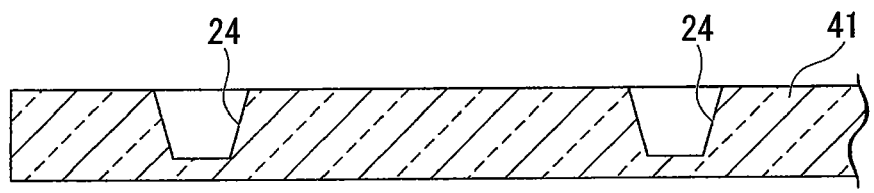
FIG. 16 is a diagram showing the recess forming step of the piezoelectric vibrator manufacturing method shown in FIG. 8.

In the hole forming step, first, as shown in FIG. 14, the recess forming mold 51 is placed with the convex portions 53 positioned on the upper side, and the base board wafer 41 is placed thereon. As shown in FIG. 15, this assembly is placed in a heating furnace (not shown), and pressure is applied thereto in a high temperature state of, for example, about 900° C. which is equal to or higher than the softening point of the glass material that forms the base board wafer 41. In this way, as shown in FIG. 16, the shapes of the convex portions 53 are transferred to the base board wafer 41, whereby non-penetrating tapered recess portions 24 are formed. After that, the base board wafer 41 is cooled gradually while decreasing the temperature.

In the illustrated example, the inner diameter at the opening side of the recess portion 24 is larger than the largest outer diameter (the outer diameter at the bottom side of the truncated conical shape) of the electrode member 8. The inner diameter at the bottom side of the recess portion 24 is smaller than the largest outer diameter of the electrode member 8.

Here, since the planar portion 52 and the convex portions 53 are made of a carbon material, the base board wafer 41 heated and softened will not adhere onto the planar portion 52 and the convex portions 53. Therefore, the recess forming mold 51 can be easily removed from the base board wafer 41.

Moreover, since the planar portion 52 and the convex portions 53 are made of a carbon material, they absorb gas generated from the base board wafer 41 in the high temperature state and prevent forming of pores in the base board wafer 41, thus decreasing porosity of the base board wafer 41. In this way, it is possible to secure air-tightness of the cavity C.

In addition, since the recess forming mold 51 having truncated conical convex portions 53 short in height is used, the molding of the convex portions 53 is durable as compared to a penetration hole forming mold having cylindrical convex portions of sufficient height for forming the penetration holes penetrating through the base board wafer 41 as the convex portions 53, for example. Moreover, since the non-penetrating recess portions 24 are formed on the base board wafer 41, the molding can be performed easily compared to the case of forming penetration holes.

The recess forming mold 51 may be formed of materials including any one of aluminum oxide, zirconium oxide, boron nitride, and silicon nitride as a main component in place of the carbon material. Since the recess forming mold 51 is formed of the above-mentioned materials, the heat resistance is high, the thermal deformation is small, and has a good demolding property. Thus, the workability and handleability are good.

(Electrode Member Disposing Step)

Figure 17:
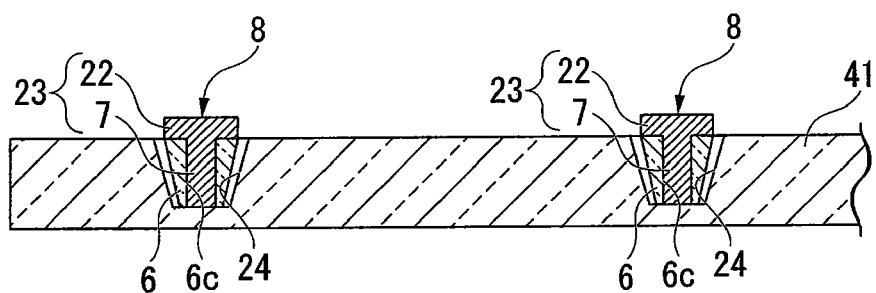
FIG. 17 is a diagram showing an electrode member disposing step of the piezoelectric vibrator manufacturing method shown in FIG. 8.

Subsequently, a step of disposing the electrode members 8 in the recess portions 24 is performed (S23). At this time, as shown in FIG. 16, the base board wafer 41 is placed with the recess portions 24 opened upward. Thereafter, as shown in FIG. 17, the electrode members 8 are inserted, from the above, into the recess portions 24 using an inserting machine (not shown), for example. At this time, the electrode members 8 are inserted into the recess portions 24 from the apex side (the cylindrical member 6 side) of the truncated conical shape, and the end surfaces (the apex surface of the truncated conical shape) of the electrode members 8 come into contact with the bottom portions of the recess portions 24. In this state, a gap is formed between the outer circumferential surfaces of the cylindrical members 6 and the inner circumferential surfaces of the recess portions 24, and the base portions 22 of the rivet members 23 protrude upward from the base board wafer 41.

Here, since the electrode members 8 have a truncated conical shape, and a tapered surface is formed on the recess portions 24, the electrode members 8 can be disposed easily. Moreover, when the electrode members 8 are disposed in the recess portions 24, the electrode members 8 come into contact with the bottom portions of the recess portions 24, and the electrode members 8 will not come out by passing through the recess portions 24.

In the present embodiment, the inner diameter at the bottom side of the recess portion 24 is smaller than the largest outer diameter of the electrode member 8. Therefore, if the electrode member 8 is inserted into the recess portion 24 from the bottom side of the truncated conical shape, the end surface (the bottom surface of the truncated conical shape) of the electrode member 8 will be caught at the inner circumferential surface of the recess portions 24 before coming into contact with the bottom portion of the recess portion 24. Therefore, the posture of the electrode member 8 is not stable. Therefore, when the electrode members 8 disposed on the upper surface of the base board wafer 41 are inserted and disposed in the recess portions 24 by shaking the base board wafer 41, the electrode members 8 inserted into the recess portions 24 from the bottom side of the truncated conical shape will not be stabilized in the recess portions 24. Therefore, the directions of the electrode members 8 disposed in different recess portions 24 are likely to result in a state where the electrode members 8 are inserted from the apex side of the truncated conical shape.

(Welding Step)

Figure 18:
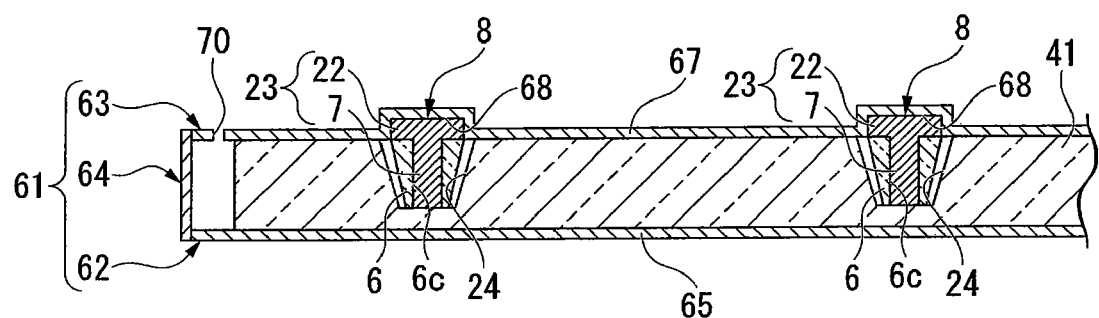
FIG. 18 is a diagram showing a welding step of the piezoelectric vibrator manufacturing method shown in FIG. 8.

Subsequently, a step of heating the base board wafer 41 and the electrode members 8 so as to be welded to each other is performed (S24). In the present embodiment, as shown in FIG. 18, the welding step is performed by placing the base board wafer 41 in a welding mold 61 which is made of a carbon material and includes a receiving mold 62 disposed on the lower side of the base board wafer 41, a pressurizing mold 63 disposed on the upper side of the base board wafer 41, and side plates 64 provided on the sides of the receiving mold 62 and the pressurizing mold 63 and heating the base board wafer 41 while pressing the base board wafer 41 with the welding mold 61.

The receiving mold 62 is a mold that holds the lower side of the base board wafer 41 and has a shape such that it is larger than the base board wafer 41 in top view. The receiving mold 62 includes a receiving mold planar portion 65 which making contact with the surface of the base board wafer 41 when holding the base board wafer 41.

The pressurizing mold 63 is a mold that presses the base board wafer 41. The pressurizing mold 63 has a shape such that it is larger than the base, board wafer 41 in top view and it extends along the upper side of the base board wafer 41 in which the electrode members 8 are disposed in the recess portions 24, and the base portions 22 protrude from the surface of the base board wafer 41. The pressurizing mold 63 includes a pressurizing mold planar portion 67 which makes contact with the surface of the base board wafer 41 when pressing the upper side of the base board wafer 41 and pressurizing mold recess portions 68 which correspond to the base portions 22 of the rivet members 23.

The pressurizing mold recess portions 68 are formed in alignment with the positions of the base portions 22 of the electrode members 8 disposed in the recess portions 24 of the base board wafer 41, and the base portions 22 are inserted therein. Since the base portions 22 are inserted into the pressurizing mold recess portions 68, the pressurizing mold 63 is able to hold the electrode members 8, and the electrode members 8 are prevented from being removed or displaced. The base portions 22 are not displaced from the bottom portions of the pressurizing mold recess portions 68, and the base portions 22 are pressed by the pressurizing mold 63 at the time of pressing during the welding step.

The pressurizing mold 63 includes a slit 70 which is provided at an end thereof so as to penetrate through the pressurizing mold 63. The slit 70 can be used as an escape hole for the air and surplus glass material of the base board wafer 41 when the base board wafer 41 is heated and pressed.

In the welding step, first, the base board wafer 41 and the electrode members 8 set on the welding mold 61 are placed on a mesh belt made of metal, and in such a state, they are inserted in a heating furnace and heated. Moreover, as shown in FIG. 19, using a press machine or the like disposed in the heating furnace, the base board wafer 41 is pressed by the pressurizing mold 63 at a pressure of 30 to 50 g/cm$^2$, for example.

The heating temperature is set to a temperature (for example, about 900° C.) higher than the softening point (for example, 545° C.) of the glass material that forms the base board wafer 41 and the cylindrical members 6.

The heating temperature is increased gradually, and the temperature increase stops temporarily at a time when the heating temperature reaches a temperature (for example, 550° C.) that is about 5° C. higher than the softening point of the glass material, and then the temperature increase goes on to about 900° C. In this way, by temporarily stopping the temperature increase at a temperature about 5° C. higher than the softening point of the glass material and maintaining the temperature, the softening of the base board wafer 41 and the cylindrical members 6 can be made uniform.

Figure 19:
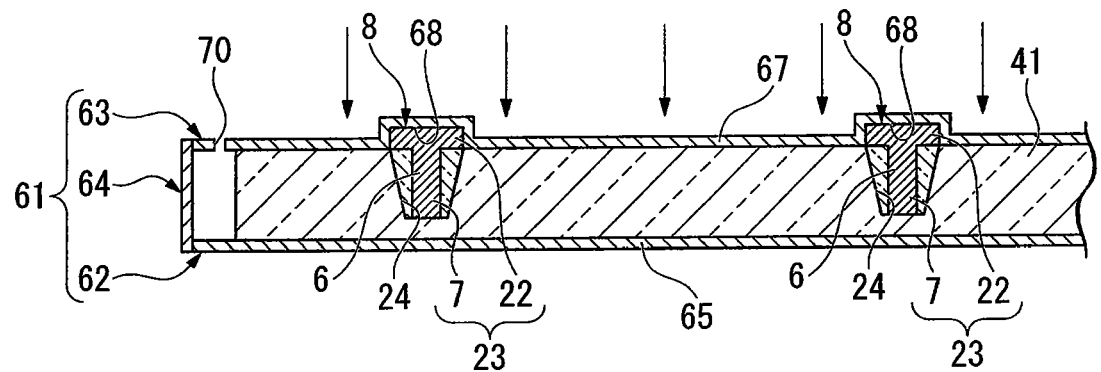
FIG. 19 is a diagram showing the welding step of the piezoelectric vibrator manufacturing method shown in FIG. 8.

As shown in FIG. 19, since the base board wafer 41 is pressed in the high temperature state, the base board wafer 41 and the cylindrical members 6 are moved, so that a gap between the outer circumferential surface of each of the cylindrical members 6 and the inner circumferential surface of each of the recess portions 24 is closed. Thus, the base board wafer 41 and the electrode members 8 are welded to each other.

The welding mold 61 may be formed of materials including any one of aluminum oxide, zirconium oxide, boron nitride, and silicon nitride as a main component in place of the carbon material. Since the welding mold 61 is formed of the above-mentioned materials, the heat resistance is high and the thermal deformation is small. Moreover, the demolding property when the mold is removed is good, and the workability is good. In addition, the surface finishing property of the pressed base board wafer 41 is good. Moreover, for example, by forming another convex or recess portion on the welding mold 61, a recess or convex portion may be formed on the base board wafer 41 at the same time as when the base board wafer 41 is welded to the electrode members 8.

(Cooling Step)

Subsequently, the base board wafer 41 and the electrode members 8 are cooled (S25).

The cooling of the base board wafer 41 and the electrode members 8 is performed by gradually decreasing the temperature from about 900° C. which is the heating temperature during the welding step. The rate of cooling is set such that the rate of cooling from about 900° C. to a temperature of 50° C. higher than the strain point of the glass material that forms the base board wafer 41 and the cylindrical members 6 is faster than the rate of cooling from a temperature of 50° C. higher than the strain point to a temperature of 50° C. lower than the strain point. Particularly, the cooling from the slow cooling point of the glass material that forms the base board wafer 41 and the cylindrical members 6 to the strain point is performed slowly.

When cooling from a temperature 50° C. higher than the strain point to a temperature 50° C. lower than the strain point, the base board wafer 41 and the electrode members 8 is moved to another furnace, for example.

In this way, by slowly performing the cooling between the temperatures within 50° C. of the strain point, it is possible to suppress the occurrence of strains in the base board wafer 41 and the cylindrical members 6. Moreover, if strains are formed in the base board wafer 41 or the cylindrical members 6, a gap may be formed between the inner circumferential surface of each of the recess portions 24 and the outer circumferential surface of each of the electrode members 8, and a crack may be formed in the base board wafer 41 or the cylindrical members 6 near the electrode members 8. Therefore, by preventing deformation of the base board wafer 41 and the cylindrical members 6, it is possible to realize a state where the base board wafer 41 is reliably welded to the electrode members 8.

Moreover, since the base board wafer 41 and the cylindrical members 6 are formed of the same glass material, the thermal expansion coefficients of both of them are equal to each other. Therefore, for example, when the electrode members 8 and the base board wafer 41 are cooled during the cooling step, it is possible to reliably prevent the occurrence of a gap between the cylindrical members 6 and the base board wafer 41 due to a difference in the thermal expansion coefficients of both of them or forming of cracks in the base board wafer 41 near the electrode members 8.

The cooling time may be reduced by setting the rate of cooling from a temperature 50° C. lower than the strain point to the room temperature so as to be faster than the rate of cooling from a temperature 50° C. higher than the strain point to a temperature 50° C. lower than the strain point. In the recess forming step, the cooling of the heated base board wafer 41 may be performed in accordance with the above-described cooling method.

(Polishing Step)

Figure 20:
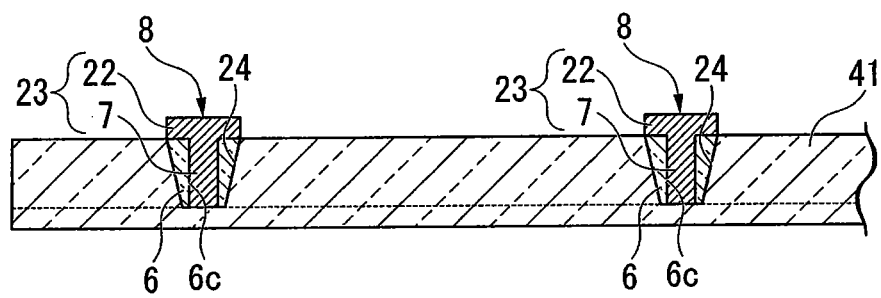
FIG. 20 is a diagram showing a polishing step of the piezoelectric vibrator manufacturing method shown in FIG. 8.

Subsequently, the base portions 22 of the electrode members 8 and the base board wafer 41 on the bottom side of the recess portions 24 are polished and removed as shown in FIG. 20 (S26 and S27).

Figure 21:
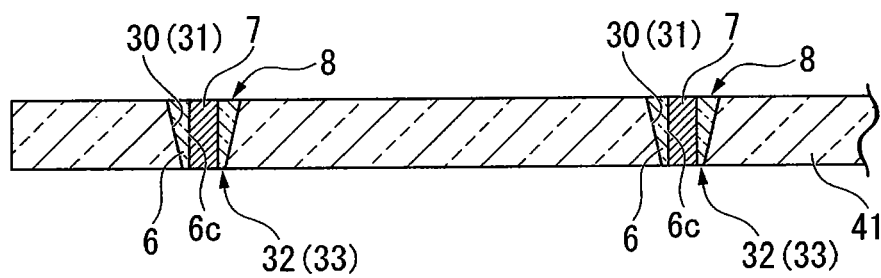
FIG. 21 is a diagram showing the polishing step of the piezoelectric vibrator manufacturing method shown in FIG. 8.

The polishing of the base portions 22 and the core portions 7 of the electrode members 8 is performed by the known method. As shown in FIG. 21, the recess portions 24 are penetrated to form through-holes 30 and 31, and the ends of the core portions 7 are exposed from the base board wafer 41. In this way, the surface of the base board wafer 41 is approximately even with the surfaces of the penetration electrodes 32 and 33 (electrode members 8). By doing so, the penetration electrodes 32 and 33 are formed in the base board wafer 41.

The base portions 22 may be used as they were without being removed. For example, the base portions 22 may be used as a radiator plate.

Subsequently, a bonding film forming step is performed where a conductive material is patterned on the upper surface of the base board wafer 41 to form a bonding film (S28), and a lead-out electrode forming step is performed (S29).

In this way, the step of manufacturing the base board wafer 41 ends.

Subsequently, at the same or a different time as the manufacturing of the base board 2, a lid board wafer later serving as the lid board 3 is manufactured (S30). In the step of manufacturing the lid board 3, first, a disk-shaped lid board wafer later serving as the lid board 3 is formed. Specifically, a soda-lime glass is polished to a predetermined thickness and cleaned, and then, the affected uppermost layer is removed by etching or the like (S31). Subsequently, a recess portion 3*a* to be used as the cavity C is formed in the lid board wafer by etching, press working, or the like (S32).

The piezoelectric vibrating reed 4 is disposed in the cavity C formed between the base board wafer 41 and the lid board wafer formed in this way so as to be mounted on the penetration electrodes 32 and 33, and the base board wafer 41 and the lid board wafer are anodically bonded to each other to form a wafer assembly.

Then, a pair of outer electrodes 38 and 39 is formed so as to be electrically connected to a pair of penetration electrodes 32 and 33, and the frequency of the piezoelectric vibrator 1 is adjusted finely. Moreover, a cutting step where the wafer assembly is cut in small fragments is performed, and an inner electrical property test is conducted, whereby a piezoelectric vibrator 1 in which the piezoelectric vibrating reed 4 is accommodated is formed.

As described above, according to the piezoelectric vibrator manufacturing method of the present embodiment, since the base board wafer 41 is pressed by the pressurizing mold 63, and the base board wafer 41 and the electrode members 8 are heated so as to be welded to each other, it is possible to form the penetration electrodes 32 and 33 without using a glass frit which includes binders of an organic material. Therefore, there is no volume reduction resulting from the removal of the organic material, and it is possible to prevent a recess portion from being formed in the penetration electrodes 32 and 33.

Therefore, since no recess portion which causes short-circuiting during a step of forming an electrode film will be formed in the cylindrical members 6 of the penetration electrodes 32 and 33, it is possible to secure stable conduction between the piezoelectric vibrating reed 4 and the outer electrodes 38 and 39. Moreover, since the base board wafer 41 can be welded to the electrode members 8, it is possible to secure stable air-tightness of the inside of the cavity C of the piezoelectric vibrator 1 and make the performance of the piezoelectric vibrator 1 uniform.

(Oscillator)

Next, an oscillator according to an embodiment of the present invention will be described with reference to FIG. 22.

Figure 22:
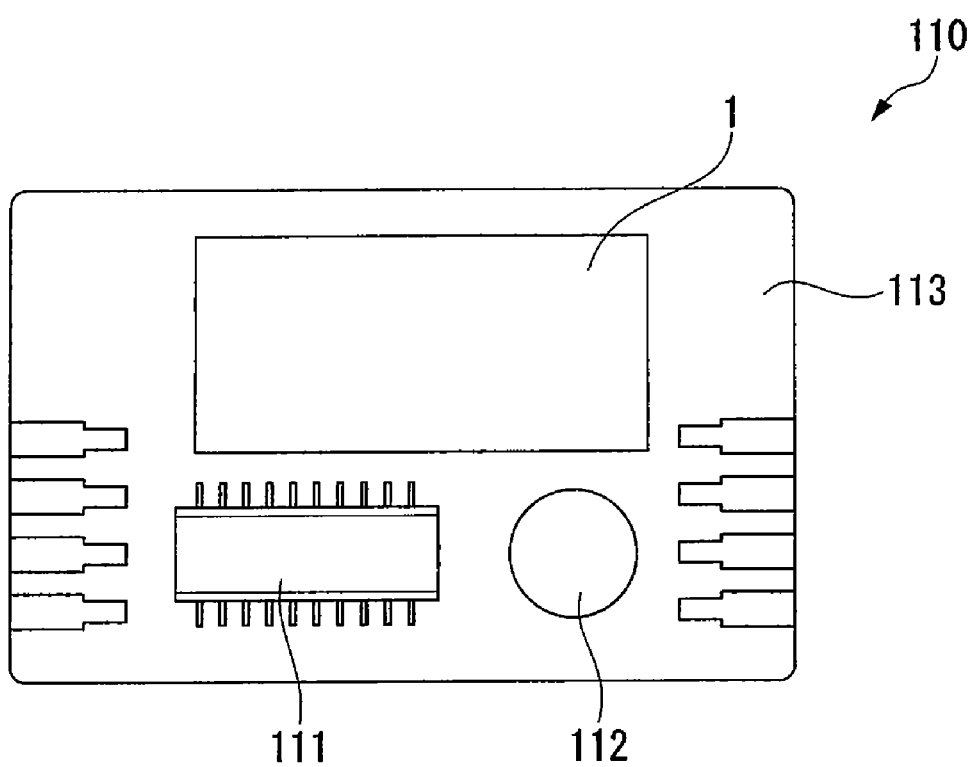
FIG. 22 is a view showing the configuration of an oscillator according to an embodiment of the present invention.

As shown in FIG. 22, an oscillator 110 of the present embodiment is one in which the piezoelectric vibrator 1 is configured as an oscillating piece that is electrically connected to an integrated circuit 111. The oscillator 110 includes a board 113 on which an electronic component 112 such as a capacitor is mounted. The integrated circuit 111 for the oscillator is mounted on the board 113, and the piezoelectric vibrating reed 4 of the piezoelectric vibrator 1 is mounted in the vicinity of the integrated circuit 111. The electronic component 112, the integrated circuit 111, and the piezoelectric vibrator 1 are electrically connected by a wiring pattern which is not shown. It should be noted that these components are molded by resin which is not shown.

In the oscillator 110 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 111 as an electrical signal. The input electrical signal is subjected to various kinds of processing by the integrated circuit 111 and is then output as a frequency signal. In this way, the piezoelectric vibrator 1 functions as an oscillating piece.

By selectively setting the configuration of the integrated circuit 111, for example, an RTC (Real Time Clock) module, according to the demand, it is possible to add a function of controlling the date or time for operating the device or an external device or providing the time or calendar in addition to a single-function oscillator for a clock.

As described above, according to the oscillator 110 of the present embodiment, since the oscillator includes the high-quality piezoelectric vibrator 1 in which the air-tightness of the inside of the cavity C is secured, stable conduction between the piezoelectric vibrating reed 4 and the outer electrodes 38 and 39 is secured, and the operation reliability is improved, it is possible to achieve an improvement in the quality of the oscillator 110 itself in which stable conduction is secured and operation reliability is improved. In addition to this, it is possible to obtain a highly accurate frequency signal which is stable over a long period of time.

(Electronic Device)

Figure 23:
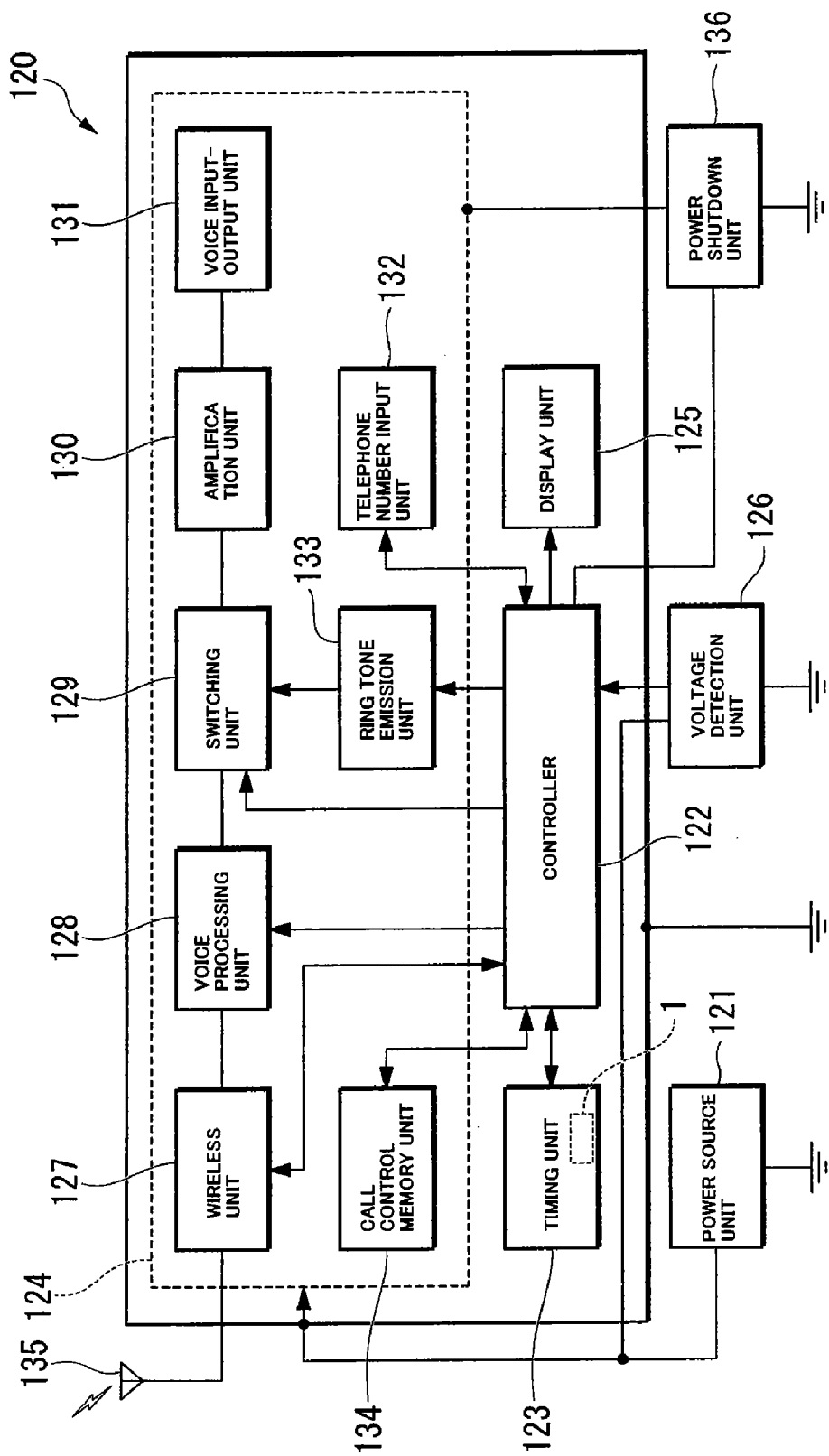
FIG. 23 is a view showing the configuration of an electronic device according to an embodiment of the present invention.

Next, an electronic device according to an embodiment of the present invention will be described with reference to FIG. 23. The present embodiment will be described by way of an example of a portable information device 120 having the piezoelectric vibrator 1 as an example of the electronic device.

First, the portable information device 120 of the present embodiment is represented, for example, by a cellular phone and is one that develops and improves a wristwatch of the related art. The portable information device 120 looks like a wristwatch in external appearance and is provided with a liquid crystal display at a portion corresponding to the dial pad and is capable of displaying the current time or the like on the screen. When the portable information device 120 is used as a communication tool, the user removes it from their wrist and performs communication as with a cellular phone of the related art using the internal speaker and microphone on the inner side of its strap. However, the portable information device 120 is remarkably small and light compared with the cellular phone of the related art.

Next, the configuration of the portable information device 120 of the present embodiment will be described. As shown in FIG. 23, the portable information device 120 includes the piezoelectric vibrator 1 and a power supply portion 121 for supplying power. The power supply portion 121 is formed, for example, of a secondary lithium battery. The power supply portion 121 is connected in parallel to a control portion 122 that performs various kinds of control, a timer portion 123 that counts the time or the like, a communication portion 124 that performs communication with the outside, a display portion 125 that displays various kinds of information, and a voltage detection portion 126 that detects voltages at the respective function portions. The power supply portion 121 supplies power to the respective function portions.

The control portion 122 controls the respective function portions so as to control the operation of the overall system, such as operations to transmit and receive audio data and operations to count and display the current time. The control portion 122 includes a ROM in which a program is written in advance, a CPU that reads out and runs the program written to the ROM, a RAM used as a work area of the CPU, and the like.

The timer portion 123 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric properties of the quartz and is input to the oscillation circuit as the electrical signal. The output of the oscillation circuit is converted to a digital form and counted by the register circuit and the counter circuit. Signals are transmitted and received to and from the control portion 122 via the interface circuit, and the current time and the current date or the calendar information or the like are displayed on the display portion 125.

The communication portion 124 is provided with the same functions as those of the cellular phone of the related art, and includes a wireless portion 127, an audio processing portion 128, a switching portion 129, an amplifier portion 130, an audio input/output portion 131, a telephone number input portion 132, a ring tone generation portion 133, and a call control memory portion 134.

The wireless portion 127 carries out transmission and reception of various kinds of data, such as audio data, with the base station via an antenna 135. The audio processing portion 128 encodes and decodes an audio signal input therein from the wireless portion 127 or the amplifier portion 130. The amplifier portion 130 amplifies a signal input therein from the audio processing portion 128 or the audio input/output portion 131 to a predetermined level. The audio input/output portion 131 is formed of a speaker and a microphone and the like, and makes a ring tone and an incoming audio louder, as well as collecting audio.

The ring tone generation portion 133 generates a ring tone in response to a call from the base station. The switching portion 129 switches the amplifier portion 130 normally connected to the audio processing portion 128 to the ring tone generation portion 133 only when a call arrives, so that the ring tone generated in the ring tone generation portion 133 is output to the audio input/output portion 131 via the amplifier portion 130.

The call control memory portion 134 stores a program relating to incoming and outgoing call control for communication. The telephone number input portion 132 includes, for example, numeric keys from 0 to 9 and other keys and the user inputs the telephone number of the communication party by depressing these numeric keys.

The voltage detection portion 126 detects a voltage drop when a voltage being applied to each function portion, such as the control portion 122, by the power supply portion 121 drops below the predetermined value, and notifies the control portion 122 of the detection. The predetermined voltage value referred to herein is a value pre-set as the lowest voltage necessary to operate the communication portion 124 in a stable manner, and for example, is about 3V. Upon receipt of a notification of a voltage drop from the voltage detection portion 126, the control portion 122 disables the operation of the wireless portion 127, the audio processing portion 128, the switching portion 129, and the ring tone generation portion 133. In particular, it is essential to stop the operation of the wireless portion 127 that consumes a large amount of power. Furthermore, a message informing that the communication portion 124 is unavailable due to insufficient battery power is displayed on the display portion 125.

More specifically, it is possible to disable the operation of the communication portion 124 and display the notification message on the display portion 125 by the voltage detection portion 126 and the control portion 122. This message may be displayed as a character message, or as a more intuitive indication, which may be displayed by putting a cross mark on the telephone icon displayed at the top of the display screen of the display portion 125.

By providing a power shutdown portion 136 capable of selectively shutting down the power supply to portions involved with the function of the communication portion 124, it is possible to stop the function of the communication portion 124 in a more reliable manner.

As described above, according to the portable information device 120 of the present embodiment, since the portable information device includes the high-quality piezoelectric vibrator 1 in which the air-tightness of the inside of the cavity C is secured, stable conduction between the piezoelectric vibrating reed 4 and the outer electrodes 38 and 39 is secured, and operation reliability is improved, it is possible to achieve an improvement in the quality of the portable information device 120 itself in which stable conduction is secured and operation reliability is improved. In addition to this, it is possible to display highly accurate clock information which is stable over a long period of time.

(Radio-Controlled Timepiece)

Next, a radio-controlled timepiece according to an embodiment of the present invention will be described with reference to FIG. 24.

Figure 24:
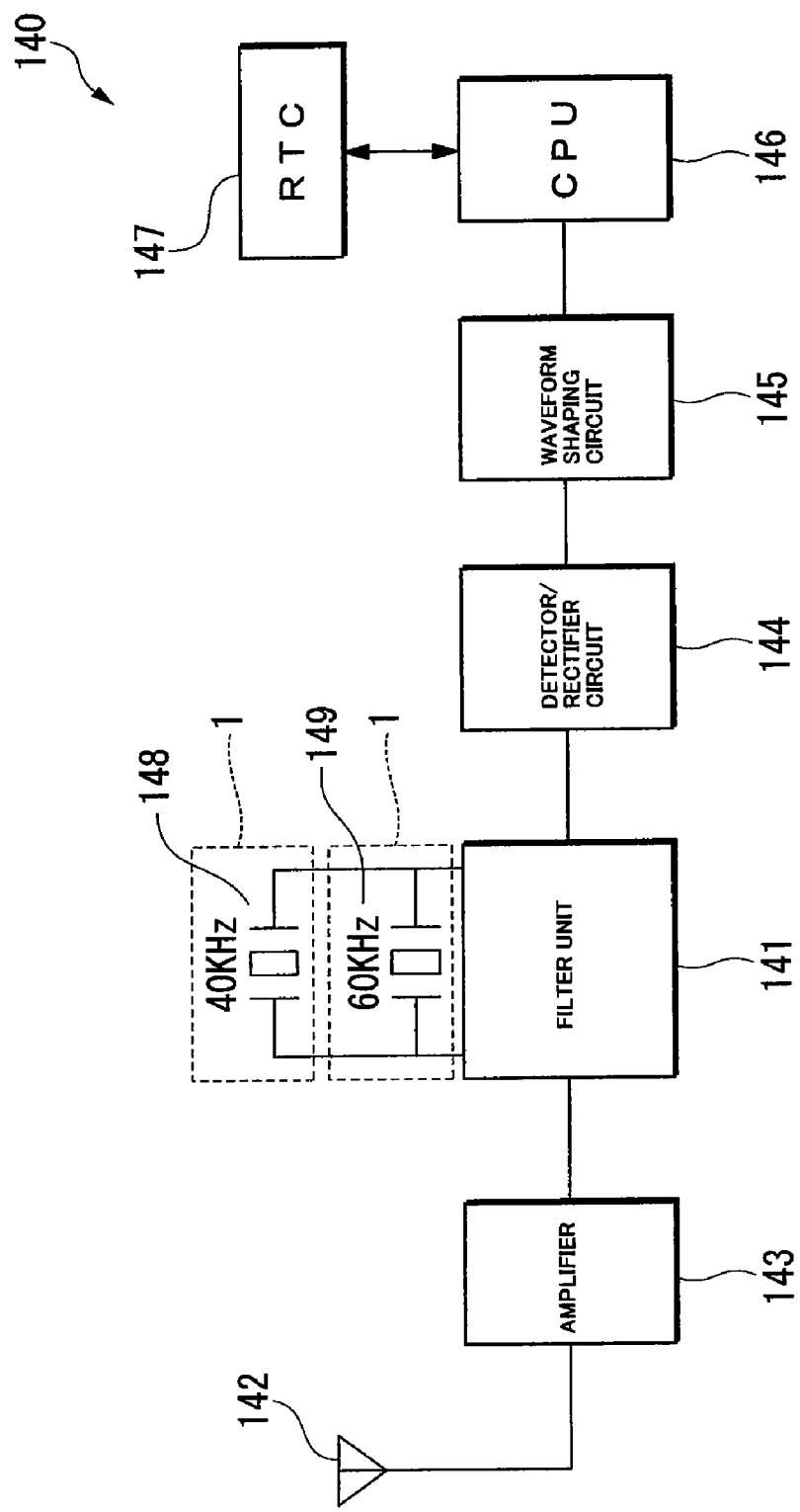
FIG. 24 is a view showing the configuration of a radio-controlled timepiece according to an embodiment of the present invention.

As shown in FIG. 24, a radio-controlled timepiece 140 of the present embodiment includes the piezoelectric vibrators 1 electrically connected to a filter portion 141. The radio-controlled timepiece 140 is a timepiece provided with the function of displaying the correct time by automatically correcting the time upon receipt of a standard radio wave including the clock information.

In Japan, there are transmission centers (transmission stations) that transmit standard radio waves in Fukushima Prefecture (40 kHz) and Saga Prefecture (60 kHz), and each center transmits the standard radio waves. Waves as long as 40 kHz or 60 kHz have a nature to propagate along the land surface and a nature to propagate while reflecting between the ionospheric layer and the land surface, and therefore have a propagation range wide enough to cover all of Japan using the two transmission centers.

Hereinafter, the functional configuration of the radio-controlled timepiece 140 will be described in detail.

An antenna 142 receives the long standard radio waves at 40 kHz or 60 kHz. The long standard radio wave is made up of time information called a time code which is modulated by the AM modulation scheme and carried on a carrier wave of 40 kHz or 60 kHz. The long standard waves received are amplified by an amplifier 143 and filtered and synchronized by the filter portion 141 having a plurality of piezoelectric vibrators 1.

In the present embodiment, the piezoelectric vibrators 1 include quartz vibrator portions 148 and 149 having resonance frequencies at 40 kHz and 60 kHz which are the same as the carrier frequency.

Furthermore, the filtered signal at the predetermined frequency is detected and demodulated by a detection and rectification circuit 144.

Subsequently, the time code is extracted by a waveform shaping circuit 145 and counted by the CPU 146. The CPU 146 reads out information about the current year, the total number of days, a day of the week, and the time. The read information is reflected on the RTC 147 and the precise time information is displayed.

Because the carrier wave is 40 kHz or 60 kHz, a vibrator having the tuning-fork structure described above is suitable for the quartz vibrator portions 148 and 149.

Although the above description has been given of an example in Japan, the frequency of the long standard waves is different overseas. For example, standard waves of 77.5 kHz are used in Germany. When the radio-controlled timepiece 140 which is also operable overseas is incorporated into a portable device, the piezoelectric vibrator 1 set at a frequency different from the frequencies used in Japan is required.

As described above, according to the radio-controlled timepiece 140 of the present embodiment, since the radio-controlled timepiece includes the high-quality piezoelectric vibrator 1 in which the air-tightness of the inside of the cavity C is secured, stable conduction between the piezoelectric vibrating reed 4 and the outer electrodes 38 and 39 is secured, and operation reliability is improved, it is possible to achieve an improvement in the quality of the radio-controlled timepiece 140 itself in which stable conduction is secured and operation reliability is improved. In addition to this, it is possible to count the time highly accurately and stably over a long period of time.

It should be noted that the technical scope of the present invention is not limited to the embodiments above, and the present invention can be modified in various ways without departing from the spirit of the present invention.

For example, in the above-described embodiment, the recess portions 24 were formed by pressing the recess forming mold 51 onto the base board wafer 41 and heating the base board wafer 41. Instead of this, the recess portions 24 may be formed by a sand blast method or the like.

In the above-described embodiment, although the rivet members 23 were used in the electrode member forming step, the present invention is not limited to this. For example, the core portion 7 that is not stand up on the base portion 22 may be inserted into the cylindrical member 6.

In the above-described embodiment, although the non-penetrating recess portion 24 were formed on the base board wafer 41 as holes in which the electrode members 8 are disposed, the present invention is not limited to this, and penetration holes penetrating through the base board wafer 41 in the thickness direction thereof may be formed.

In the above-described embodiment, although the base board wafer 41 and the cylindrical members 6 were formed of the same glass material, the present invention is not limited to this.

In the above-described embodiment, although the piezoelectric vibrator 1 was manufactured by sealing the piezoelectric vibrating reed 4 on the inside of the package 9 while using the package manufacturing method according to the present invention, devices other than the piezoelectric vibrator may be manufactured by sealing an electronic component other than the piezoelectric vibrating reed 4 on the inside of the package 9.

In the above-described embodiment, although the case where the present invention is applied to the two-layered piezoelectric vibrator 1 in which the cavity C is formed between the base board 2 and the lid board 3 was described, the present invention is not limited to this, and the present invention may be applied to a three-layered piezoelectric vibrator in which a piezoelectric board is interposed between a base board and a lid board.

In the above-described embodiment, although the electrode members 8 had a truncated conical shape, and the inner circumferential surfaces of the recess portions 24 were formed in a tapered shape in the hole forming step, the present invention is not limited to this. For example, the electrode members 8 may have a cylindrical shape, and the recess portions may be formed in a straight shape in sectional view.

In the above-described embodiment, although in the cooling step, the rate of cooling from the heating temperature during the welding step to a temperature of 50° C. higher than the strain point of the glass material that forms the base board wafer 41 is faster than the rate of cooling from a temperature 50° C. higher than the strain point to a temperature 50° C. lower than the strain point, the present invention is not limited to this.

In addition, within a range not deviating from the object of the present invention, constituent elements of the above-de-

What is claimed is:

1. A method for producing piezoelectric vibrators, comprising:
   (a) defining a plurality of first substrates on a first wafer and a plurality of second substrates on a second wafer;
   (b) forming a pair of holes in at least some of the first substrates on the first wafer;
   (c) placing a conductive rivet in at least some of the holes;
   (d) press-fusing the conductive rivets in the first wafer to hermetically close the holes;
   (e) hermetically bonding the first and second wafers such that at least some of the first substrates substantially coincide respectively with at least some of the corresponding second substrates, wherein a piezoelectric vibrating strip is secured in a respective pairs of at least some of coinciding first and second substrates; and
   (f) cutting off at least some of the hermetically bonded pairs of first and second substrates from the first and second wafers.

2. The method according to claim 1, further comprising forming a plurality of the conductive rivets each comprising a conductive pillar surrounded by a covering.

3. The method according to claim 2, wherein the covering comprises the same material as the first wafer.

4. The method according to claim 2, wherein the first wafer and the covering have expansion coefficients in a range of about 7.5 to about 8.5 ppm/° C.

5. The method according to claim 2, wherein the conductive pillar has an expansion coefficient close to but not higher than that of the covering.

6. The method according to claim 2, wherein the conductive pillar comprises kovar or Fe—Ni alloys.

7. The method according to claim 2, wherein the first and second wafers and the covering comprise a glass material.

8. The method according to claim 1, wherein forming a pair of holes at least some of the first substrates comprises pressing a die with a plurality projections onto the first wafer to form the holes with a bottom surface in the first wafer.

9. The method according to claim 1, wherein forming a pair of holes comprises forming a pair of holes each having cross-sections which become smaller as they go deeper, wherein the conductive rivet has cross-sections which become smaller as they go from one end of the rivet to the other.

10. The method according to claim 9, wherein a largest cross-section of the rivet is larger than a smallest cross-section of the hole.

11. The method according to claim 1, wherein press-fusing the conductive rivets in the first wafer comprises compressing the first wafer with the conductive rivets placed in the holes at a temperature higher than a softening temperature of the first wafer.

12. The method according to claim 11, wherein compressing the first wafer comprises compressing the first wafer under a pressure of 30-50 g/cm$^2$ and at a temperature of about 900° C.

13. The method according to claim 12, further comprising a-cooling the first wafer after step (d) and before step (e), wherein a first cooling rate adopted to cool the first wafer to about a strain point of the first wafer plus 50° C. is faster than a second cooling rate adopted to cool the first wafer from the strain point of the first wafer plus 50° C. to the strain point of the first wafer minus 50° C.

14. The method according to claim 13, wherein cooling the first wafer comprises cooling the first wafer at a third cooling rate which is adopted to cool the first wafer from the strain point of the first wafer minus 50° C. to a room temperature and is faster than the second cooling rate.

15. The method according to claim 2, further comprising grinding at least one surface of the first wafer to expose opposite ends of the conductive pillar in respective opposite surfaces of the first wafer.

16. A piezoelectric vibrator comprising:
   a hermetically closed casing comprising first and second substrates with a cavity inside, wherein the first and second substrates comprise a glass material;
   conductive rivets press-fused in the first substrate, each comprising a conductive pillar surrounded by a non-conductive covering and having an upper surface exposed inside the cavity and a lower surface larger in area than the upper surface and exposed by the first substrate; and
   a piezoelectric vibrating reed secured inside the cavity and electrically connected via a conductive pattern to the upper surface of the rivets.

17. An oscillator comprising the piezoelectric vibrator defined by claim 12.

18. An electronic apparatus comprising the oscillator of claim 17.

19. The electronic apparatus according to claim 18, wherein the electronic apparatus comprises a radio-controlled timepiece.

* * * * *

UNITED STATES PATENT AND TRADEMARK OFFICE
CERTIFICATE OF CORRECTION

PATENT NO. : 8,362,846 B2
APPLICATION NO. : 13/011401
DATED : January 29, 2013
INVENTOR(S) : Kazuyoshi Sugama et al.

It is certified that error appears in the above-identified patent and that said Letters Patent is hereby corrected as shown below:

In the Claims

In column 19, claim 8, line 39, before "at least some of the first" insert --in--.

Signed and Sealed this
Sixteenth Day of July, 2013

Teresa Stanek Rea
*Acting Director of the United States Patent and Trademark Office*